(12) United States Patent
Ahmed et al.

(10) Patent No.: US 12,635,530 B2
(45) Date of Patent: May 19, 2026

(54) ELECTRONIC DEVICE SUBSTRATE HAVING A PASSIVE ELECTRONIC COMPONENT

(71) Applicant: Intel Corporation, Santa Clara, CA (US)

(72) Inventors: Numair Ahmed, Chandler, AZ (US); Cary Kuliasha, Mesa, AZ (US); Kyu Oh Lee, Chandler, AZ (US); Jung Kyu Han, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 17/707,523

(22) Filed: Mar. 29, 2022

(65) Prior Publication Data

US 2023/0317642 A1     Oct. 5, 2023

(51) Int. Cl.
| | |
|---|---|
| *H01L 23/64* | (2006.01) |
| *H01L 21/48* | (2006.01) |
| *H01L 23/498* | (2006.01) |
| *H10D 1/20* | (2025.01) |
| *H10W 44/00* | (2026.01) |
| *H10W 70/05* | (2026.01) |
| *H10W 70/63* | (2026.01) |
| *H10W 70/65* | (2026.01) |

(52) U.S. Cl.
CPC ............ *H10W 44/501* (2026.01); *H10D 1/20* (2025.01); *H10W 70/095* (2026.01); *H10W 70/635* (2026.01); *H10W 70/65* (2026.01)

(58) Field of Classification Search
CPC ............. H01F 17/0033; H01F 17/0006; H01F 2017/0066; H01F 2017/0086; H01F 17/045; H01F 27/306; H05K 1/185; H05K 3/205
See application file for complete search history.

(56) References Cited

U.S. PATENT DOCUMENTS

| | | |
|---|---|---|
| 6,952,049 B1 | 10/2005 | Ogawa et al. |
| 8,872,349 B2 | 10/2014 | Chiu et al. |
| 10,698,164 B2 | 6/2020 | Psaila et al. |
| 2006/0169973 A1 | 8/2006 | Isa et al. |
| 2010/0187683 A1 | 7/2010 | Bakir et al. |
| 2010/0193952 A1* | 8/2010 | Arana ..................... H01L 24/11 |
| | | 257/746 |
| 2010/0244230 A1 | 9/2010 | Oi |
| 2010/0320496 A1 | 12/2010 | Nishi et al. |

(Continued)

OTHER PUBLICATIONS

Sankarasubramanian, Malavarayan, "Magnetic Inductor Arrays for Intel Fully Integrated Voltage Regulator (FIVR) on 10th generation Intel Core SoCs", 2020 IEEE 70th Electronic Components and Technology Conference (ECTC), (2020), 6 pgs.

*Primary Examiner* — Edward Chin
(74) *Attorney, Agent, or Firm* — Akona IP PC

(57) ABSTRACT

A substrate for an electronic device may include a core. The substrate may include a passive electronic component. For instance, the substrate may include a continuous layer of molding material encapsulating the passive electronic component within the core. One or more through vias may extend between a first surface of the core and a second surface of the core. The substrate may include one or more layers coupled with the core. One or more component terminals may facilitate electrical communication between the passive electronic component and one or more of the first layer or the second layer.

25 Claims, 10 Drawing Sheets

(56)                    References Cited

U.S. PATENT DOCUMENTS

| | | |
|---|---|---|
| 2011/0304999 A1 | 12/2011 | Yu et al. |
| 2014/0078704 A1 | 3/2014 | Andry et al. |
| 2014/0339705 A1 | 11/2014 | Yee |
| 2016/0043068 A1 | 2/2016 | Ramachandran et al. |
| 2016/0374198 A1 | 12/2016 | Kim et al. |
| 2018/0026666 A1 | 1/2018 | Yun et al. |
| 2018/0102311 A1 | 4/2018 | Shih |
| 2018/0344245 A1 | 12/2018 | Knickerbocker et al. |
| 2019/0074240 A1 | 3/2019 | Levesque, Jr. et al. |
| 2019/0124772 A1 | 4/2019 | Stahr et al. |
| 2020/0027728 A1 | 1/2020 | Wang et al. |
| 2020/0203266 A1 | 6/2020 | Iwai et al. |
| 2021/0118698 A1 | 4/2021 | Sawadaishi |
| 2021/0257741 A1 | 8/2021 | Flemming et al. |
| 2022/0007511 A1* | 1/2022 | Jeong .................... H05K 1/186 |
| 2022/0375865 A1 | 11/2022 | Pietambaram et al. |
| 2023/0187205 A1 | 6/2023 | Wang et al. |

* cited by examiner

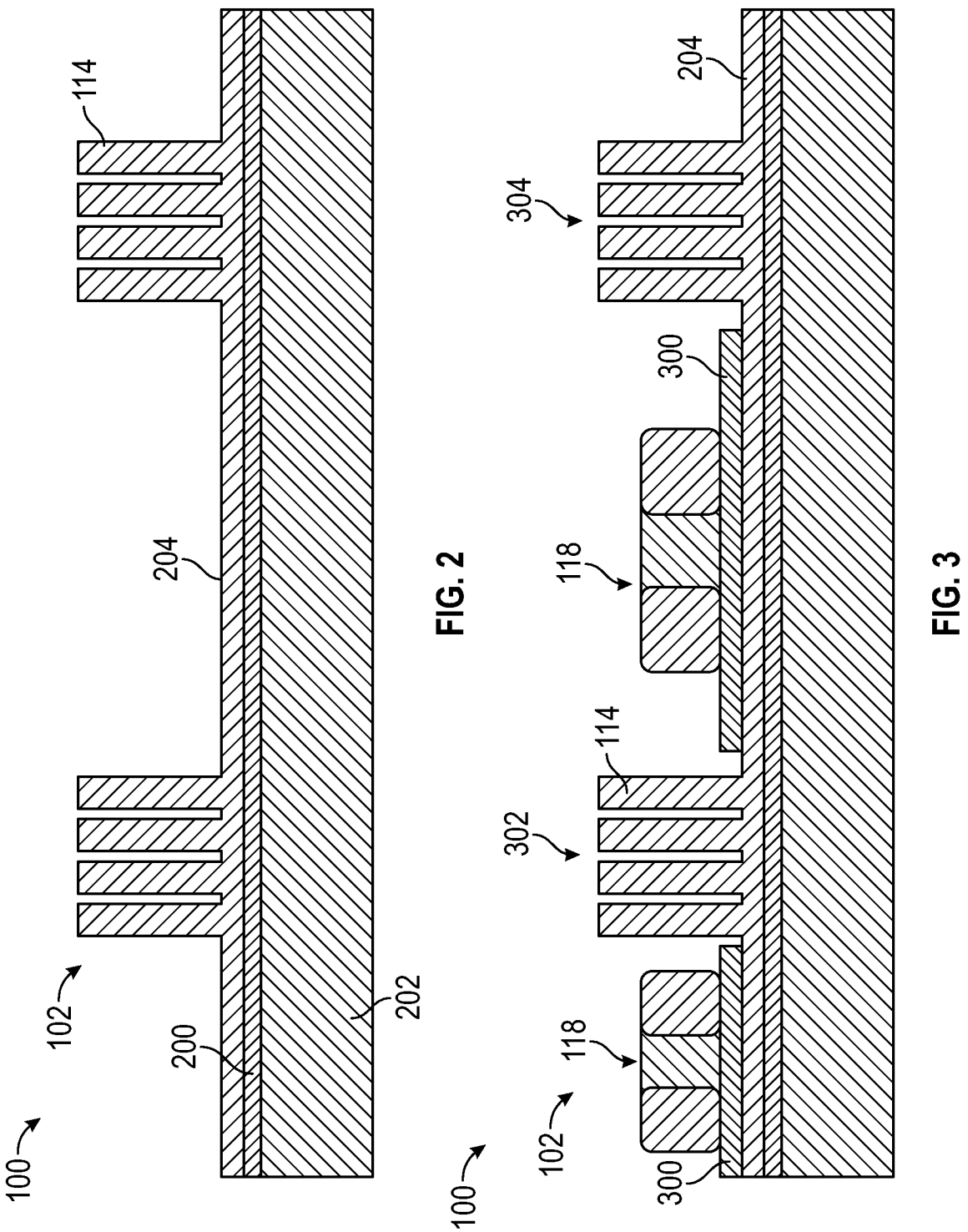

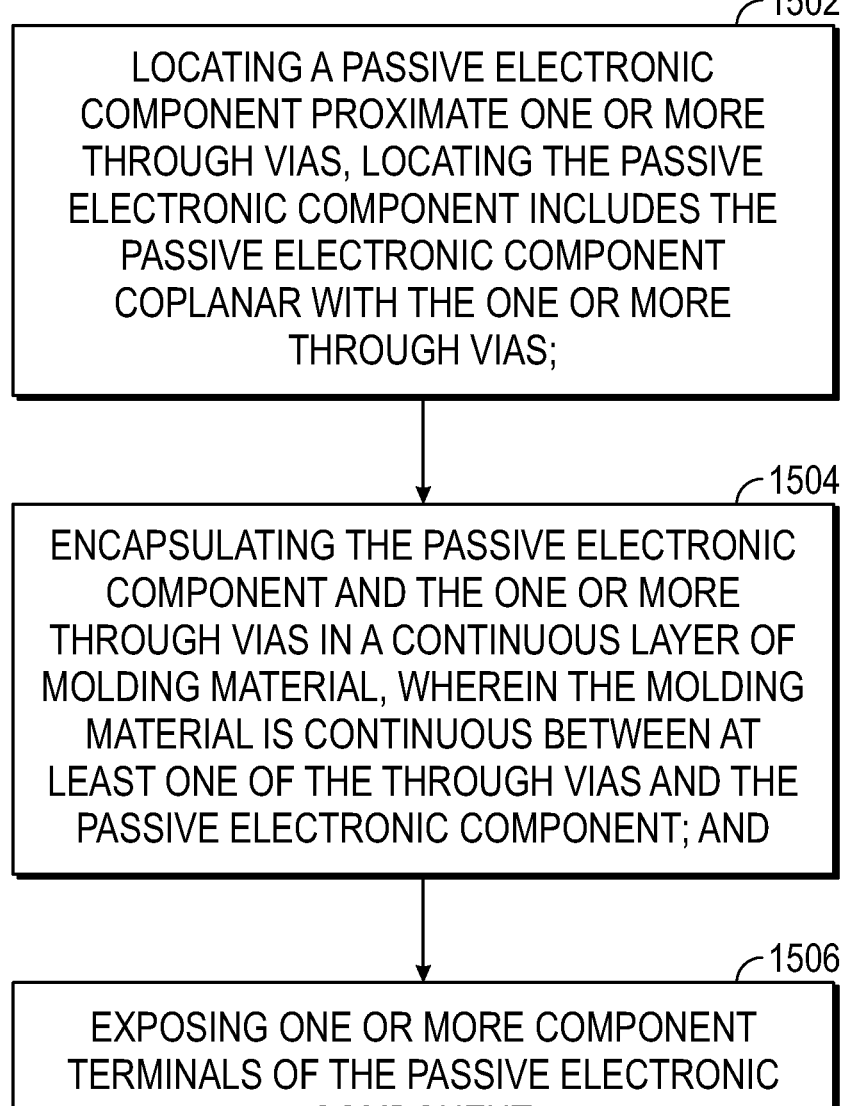

1502

LOCATING A PASSIVE ELECTRONIC COMPONENT PROXIMATE ONE OR MORE THROUGH VIAS, LOCATING THE PASSIVE ELECTRONIC COMPONENT INCLUDES THE PASSIVE ELECTRONIC COMPONENT COPLANAR WITH THE ONE OR MORE THROUGH VIAS;

1504

ENCAPSULATING THE PASSIVE ELECTRONIC COMPONENT AND THE ONE OR MORE THROUGH VIAS IN A CONTINUOUS LAYER OF MOLDING MATERIAL, WHEREIN THE MOLDING MATERIAL IS CONTINUOUS BETWEEN AT LEAST ONE OF THE THROUGH VIAS AND THE PASSIVE ELECTRONIC COMPONENT; AND

1506

EXPOSING ONE OR MORE COMPONENT TERMINALS OF THE PASSIVE ELECTRONIC COMPONENT.

FIG. 15

ELECTRONIC DEVICE SUBSTRATE HAVING A PASSIVE ELECTRONIC COMPONENT

TECHNICAL FIELD

This document pertains generally, but not by way of limitation, to a substrate for an electronic device.

BACKGROUND

In an approach, an electronic device includes a semiconductor die. The electronic device may include a substrate coupled with the semiconductor die. The substrate facilitates transmission of electrical signals to (and from) the semiconductor die. For instance, the substrate facilitates electrical communication between the semiconductor die and another component of the electronic device, such as a motherboard or the like.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2 illustrates the electronic device in correspondence with a manufacturing operation.

FIG. 3 illustrates the electronic device in correspondence with another manufacturing operation.

FIG. 15 illustrates one example of a method for manufacturing a substrate for an electronic device

DETAILED DESCRIPTION

Figure 1:
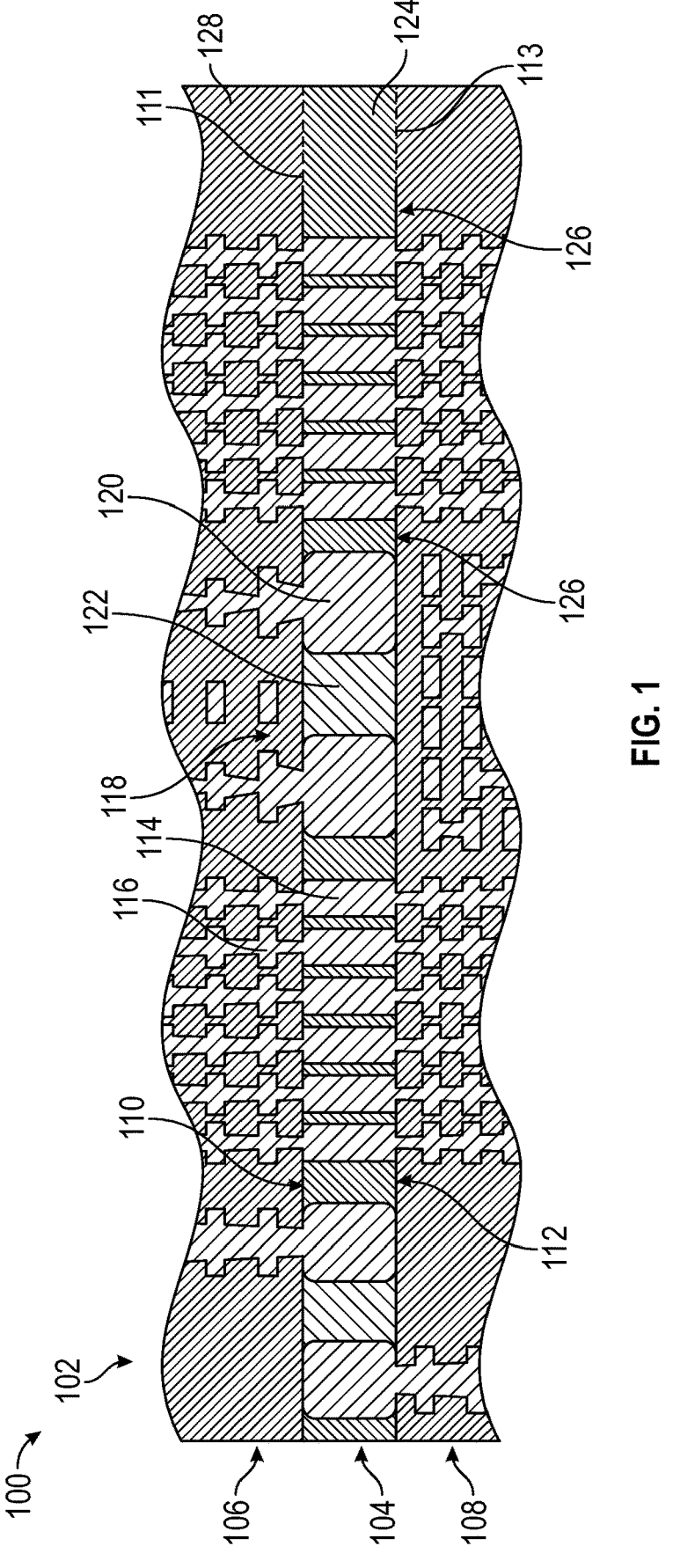
FIG. 1 illustrates an example of an electronic device.

The present inventors have recognized, among other things, that a problem to be solved may include enhancing performance of a substrate that includes a passive electronic component (e.g., an inductor, capacitor, resistor, or the like).

In an approach, an inductor is included in a core of a substrate. The inductor comprises a conductor coupled with an epoxy having a magnetic filler embedded in the epoxy. Increasing inductance of the capacitor may be limited by the epoxy having a magnetic filler. For example, permeability of the magnetic material embedded in the epoxy may become saturated at a maximum due to the composition of the epoxy. Accordingly, the inductance of the inductor may become saturated at a maximum due to the composition of the epoxy.

In another approach, the epoxy may be filled into a cavity within the substrate. The cavity may comprise a mechanically removed portion of the substrate. Manufacturing tolerances associated with mechanical removal may limit the electrical interconnect density (e.g., number of connections per unit area) of the substrate. Thus, inclusion of a passive electronic component within the substrate using mechanical removal of the substrate and filling of a cavity may limit electrical interconnect density of the substrate (in comparison to lithography) because of the tolerances associated with mechanical drilling and filling of a cavity with an epoxy. Accordingly, increasing electrical interconnect density of the substrate becomes challenging in correspondence with inclusion of an epoxy-filled inductor within the substrate.

The present subject matter can help provide a solution to this problem, such as with a substrate for an electronic device. The substrate may include a core having a first surface and a second surface. The core may include a passive electronic component. For instance, the core may include the passive electronic component coupled with a molding material. In another example, the core may include the passive electronic component within a continuous layer of the molding material. For instance, the passive electronic component may comprise a discrete (e.g., separate, distinct, individual, discontinuous, different, or the like) unit within the core of the substrate. The substrate may include the passive electronic component embedded within the continuous layer of molding material. Accordingly, the continuous layer of molding material may be discontinuous at an interface with the passive electronic component. Thus, the core of the substrate may include the passive electronic component without mechanical drilling and filling of the cavity with an epoxy.

The substrate having a passive electronic component within a continuous layer of molding material may facilitate an increase in electrical interconnect density (e.g., number of connections per unit area) of the substrate. In some examples, tolerances associated with lithography are an order of magnitude greater than tolerances associated with mechanical removal of the substrate. Accordingly, additional structures of the substrate, for instance through vias, may be located closer in proximity to the passive electronic component than a substrate having a passive electronic component within a cavity defined through mechanical removal. For example, a keep out zone associated with the passive electronic component within a continuous layer of molding material is less than a keep out zone associated with the passive electronic within a cavity defined through mechanical removal. Thus, the present subject matter includes a substrate having a passive electronic component included within the core of the substrate without mechanical removal and filling of the core to include the passive electronic component within the substrate.

In contrast to mechanical removal, the substrate having the passive electronic component within a continuous layer of molding material may utilize lithography to embed (or interconnect) the passive electronic component within the core of the substrate. Accordingly, the substrate having the passive electronic component within the continuous layer of molding material allows inclusion of the passive electronic component (having a higher inductance) within the electronic device. In another example, the substrate facilitates an increase in electrical interconnect density. For example, the increase in electrical interconnect density may allow the substrate to transmit more electric signals per unit area. In yet another example, the increase in electrical interconnect density facilitates the inclusion of additional passive electronic components within the substrate. Thus, the increase in electrical interconnect density correspondingly enhances the performance of the electronic device by providing additional electrical interconnects (or passive electronic components) per unit area within the core.

The core may include one or more through vias extending between the first surface of the core and the second surface of the core. Accordingly, the through vias may facilitate electrical communication between a first side (e.g., top side, or the like) of the core and a second side (e.g., bottom side, or the like) of the core.

In another example, the substrate may include one or more layers coupled with the core. For instance, the substrate may include a first layer coupled with the first surface of the core. The substrate may include a second layer coupled with the second surface of the core. Accordingly, the through vias may facilitate electrical communication between the first layer of the substrate and the second layer of the substrate.

The passive electronic component may include one or more component terminals. The component terminals may facilitate electrical communication between the passive electronic component and other portions of the substrate, for example communication with one or more of the first layer or the second layer of the substrate. The passive electronic component may communicate with the through vias using one or more of the component terminals, the first layer, or the second layer.

This overview is intended to provide an overview of subject matter of the present patent application. It is not intended to provide an exclusive or exhaustive explanation of the invention. The detailed description continues, and provides further information about the present patent application.

FIG. 1 illustrates an example of an electronic device 100. The electronic device 100 may include a substrate 102. The substrate 102 may facilitate electrical communication within the electronic device 100. For instance, the electronic device 100 may include a semiconductor die coupled with the substrate 102.

The substrate 102 may include a core 104. In some examples, the core 104 may enhance the strength of the substrate 102. For instance, the core 104 may include a glass cloth that enhances the strength of the core 104 (however the present subject matter is not so limited). The enhanced strength of the core 104 may minimize warping of the substrate 102.

In another example, the substrate 102 may include a first layer 106 coupled with the core 104. For instance, the substrate 102 may include the first layer 106 coupled with a first surface 110 of the core 104. For instance, the substrate 102 may include the first layer 106 coupled with the first surface 110 at a first interface 111. The substrate 102 may include a second layer 108 coupled with the core 104. For example, the substrate 102 may include the second layer 108 coupled with a second surface 112 of the core 104. The substrate 102 may include the second layer 108 coupled with the second surface 112 at a second interface 113. In another example, the substrate 102 includes the first surface 110 of the core 104 on an opposite side of the core 104 with respect to the second surface 112 of the core 104.

In yet another example, the core 104 facilitates electrical communication between the first layer 106 and the second layer 108. The core 104 may include one or more through vias 114. The through vias 114 may facilitate electrical communication between the first layer 106 and the second layer 108. For instance, the through vias 114 may extend between the first surface 110 of the core 104 and the second surface 112 of the core 104. Accordingly, the through vias 114 may transmit one or more electrical signals between the first layer 106 and the second layer 108. In an example, the through vias 114 may facilitate electrical communication between one or more electrical traces 116 of the first layer 106 and the second layer 108.

The substrate 102 may include a passive electronic component 118. For example, the core 104 may include the passive electronic component 118. The passive electronic component 118 may include one or more of an inductor, capacitor, resistor, or the like. The passive electronic component 118 may electrically communicate with one or more of the first layer 106 or the second layer 108. For instance, the passive electronic component 118 may include one or more component terminals 120. The component terminals 120 may electrically communicate with the traces 116 of the layers 106, 108 of the substrate 102.

The passive electronic component 118 may include a central section 122. In some examples, the central section 122 may correspond with a core of an inductor. For instance, the central section 122 may include a magnetic material. The magnetic material of the central section 122 may enhance the inductance of the passive electronic component 118. For instance, the magnetic material of the central section 122 may have a high permeability. The central section 122 may include a uniform magnetic material (in contrast to an epoxy filled with magnetic filler). Accordingly, in some examples, the central section includes a uniform (e.g., unitary, homogeneous, or the like) magnetic material (or alloy of magnetic materials) in contrast to a composite of a polymer and the magnetic material. For example, the central section may include a metal, such as one or more of iron, cobalt, nickel, ferrites, alloys thereof, or the like. In another example, the central section 122 may include a ceramic material. Thus, the central section 122 may have enhanced magnetic permeability.

The substrate 102 may include a molding material 124. For instance, the core 104 may include the molding material 124. The molding material 124 may include a dielectric. In another example, the molding material 124 may include one or more fillers that enhance the strength of the molding material 124. In yet another example, the core 104 may include the molding material 124 coupled with the passive electronic component 118. In still yet another example, the core 104 may include the molding material coupled with the through vias 114.

The core 104 may include a continuous layer 126 of the molding material 124. For example, the core 104 may include the continuous layer 126 of molding material 124 between the passive electronic device 118 and at least one of the through vias 114. The core 104 may include the continuous layer 126 of molding material 124 between each of the through vias 114. The core 104 may include the continuous layer 126 of the molding material 124 between the first surface 110 and the second surface 112 of the core 104. Accordingly, the continuous layer 126 of the molding material 124 may extend between the first layer 106 and the second layer 108.

The continuous layer 126 of the molding material 124 may include detectable physical properties observable through one or more destructive or non-destructive evaluation operations. For instance, the continuous layer 126 of molding material 124 may include an observable grain structure corresponding to the continuous layer 126 of the molding material 124. In an example, injection of the molding material 124 induces flow the molding material 124 around a discrete component, such as the passive electronic component 118. In another example, one or more fillers included in the molding material 124 may orient around the discrete component (in a detectable manner) as the molding material 124 flows around the discrete component. Accordingly, an observer may detect the continuous layer 126 of the molding material 124 based on physical properties of the continuous layer 126 of the molding material 124.

In an example, the substrate 102 may include a dielectric material 128 of the first layer 106 (or the second layer 108) coupled with the continuous layer 126 of the molding material 124. An observer may detect the interfaces 111, 113 between the dielectric material 128 and the continuous layer 126 of the molding material 124. For example, an observer may detect a discontinuity (e.g., seam, joint, interruption, or the like) at the interfaces 111, 113 between the layers 106, 108 and the continuous layer 126 of the molding material 124. Thus, an observer may detect the continuous layer 126 of the molding material 124 using one or more destructive or non-destructive evaluation operations.

FIG. 2 illustrates the electronic device 100 in correspondence with a manufacturing operation. In an example, a release film 200 may be coupled with a carrier 202. A layer of conductive material 204 may be coupled with one or more of the release film 200 or the carrier 202. In an example, a plating operation (e.g., electroplating, electrolysis, or the like) may couple the conductive material 204 with one or more of the release film 200 or the carrier 202. In another example, the conductive material 204 comprises the through vias 114. Accordingly, the conductive material 204 may provide one or more structures within the substrate 102 that facilitate transmission of an electronic signal within the substrate 102.

FIG. 3 illustrates the electronic device 100 in correspondence with another manufacturing operation. In an example, an adhesive 300 (e.g., a dry attach film, die bonding film, tape, or the like) may be coupled with the conductive material 204. For instance, the adhesive 300 may be located between a first set 302 of the through vias 114 and a second set 304 of the through vias 114.

In another example, one or more passive electronic components, for instance the passive electronic component 118, may be coupled with the adhesive 300. In yet another example, the passive electronic component 118 may be located between the first set 302 of the through vias 114 and the second set 304 of the through vias 114. Accordingly, the passive electronic component 118 may be coplanar (e.g., at a similar level, within the core 104, or the like) with portions of the through vias 114.

Figures 4, 5:
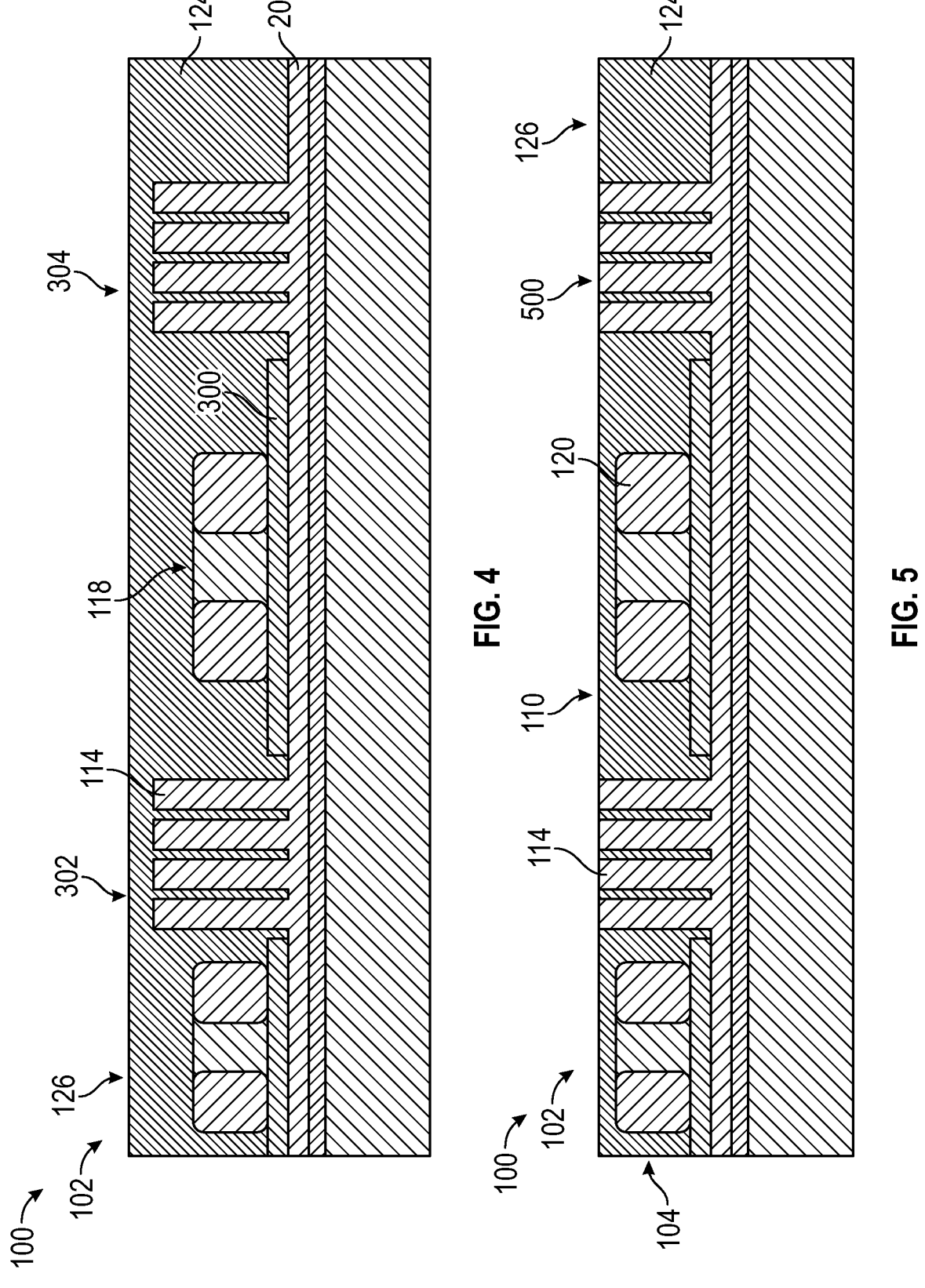
FIG. 4 illustrates the electronic device in correspondence with yet another manufacturing operation.
FIG. 5 illustrates the electronic device in correspondence with still yet another manufacturing operation.

FIG. 4 illustrates the electronic device 100 in correspondence with yet another manufacturing operation. The substrate 102 may include the molding material 124. In an example, substrate 102 may include the molding material 124. For instance, the substrate 102 may include the continuous layer 126 of the molding material 124.

In another example, the substrate 102 may include the continuous layer 126 of the molding material 124 coupled with the conductive material 204. For instance, the substrate 102 may include the continuous layer 126 of the molding material 124 coupled with the through vias 114. The substrate 102 may include the continuous layer 126 of the molding material 124 coupled with the passive electronic component 118. The continuous layer 126 of the molding material 124 may extend between at least one of the through vias 114 and the passive electronic component 118. The continuous layer 126 of the molding material 124 may extend between the first set 302 of the through vias 114 and the second set 304 of the through vias 114. Accordingly, the substrate 102 may include components of the electronic device 100 within the continuous layer 126 of the molding material 124. For instance, the substrate 102 may include the components (e.g., the passive electronic component 118, or the like) embedded (e.g., enclosed, encased, surrounded, enveloped, contained, or the like) within the continuous layer 126 of the molding material 124.

FIG. 5 illustrates the electronic device 100 in correspondence with still yet another manufacturing operation. In an example, portions of the molding material 124 may be removed, for instance with a mechanical removal operation (e.g., grinding, sanding, ablating, or the like). In another example, portions of the molding material 124 and the conductive material 204 may be removed simultaneously (e.g., with cogrinding of the molding material 124 and the vias 114, or the like). Accordingly, the substrate 102 may include the first surface 110 of the core 104.

In yet another example, the core 104 includes the through vias 114 exposed on the first surface 110 of the core 104. For instance, the core 104 may include a first via surface 500 coplanar with the first surface 110 of the core 104. In still yet another example, the component terminals 120 of the passive electronic component 118 are recessed with respect to the first surface 110 of the core 104. For instance, the core 104 may include the passive electronic component 118 within the continuous layer 126 of the molding material 124. In some examples, the core 104 may include the passive electronic component 118 below the first surface 110 (and within the continuous layer 126 of the molding material 124).

Figures 6, 7:
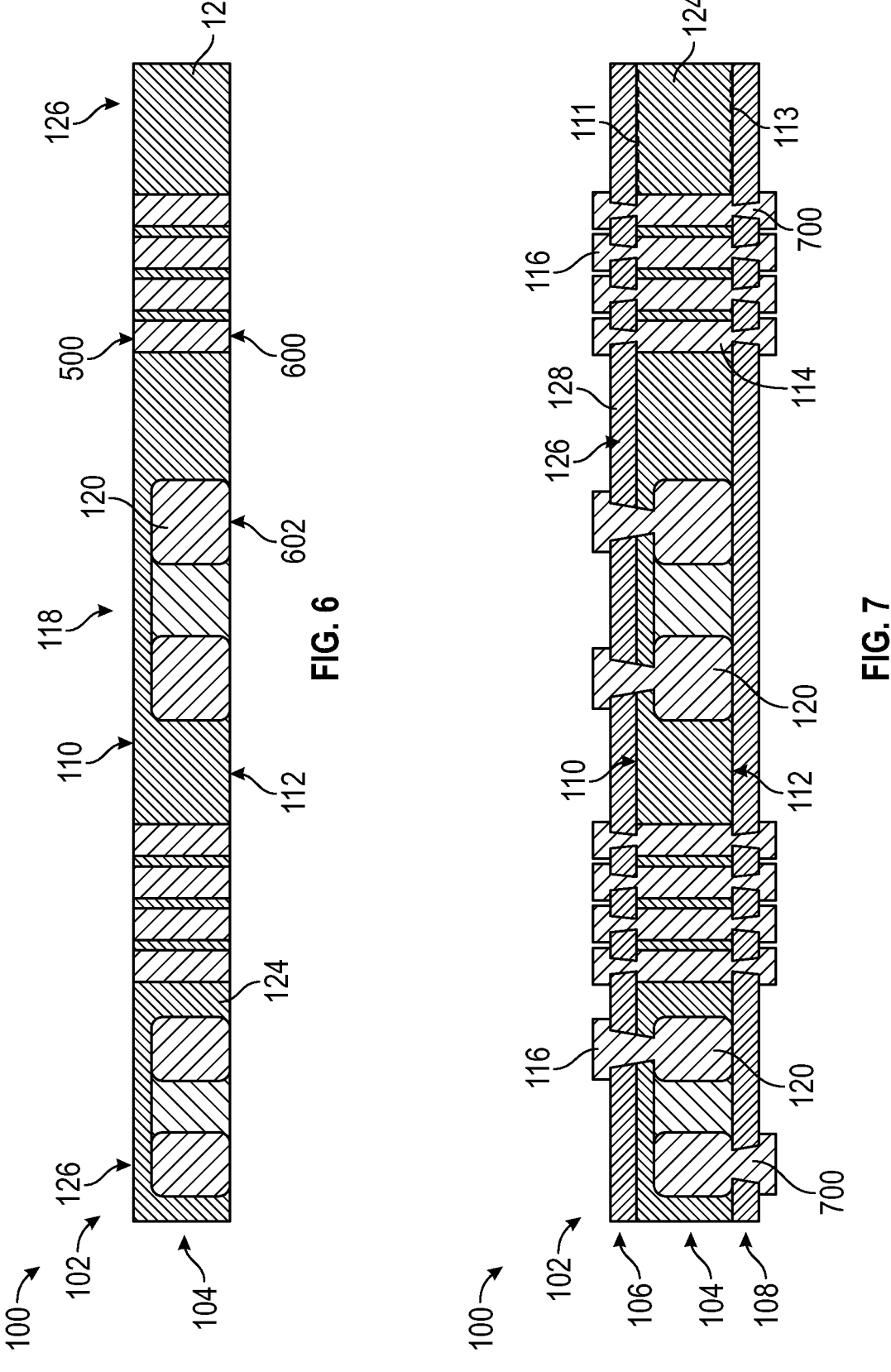
FIG. 6 illustrates the electronic device in correspondence with still yet another manufacturing operation.
FIG. 7 illustrates the electronic device in correspondence with a further manufacturing operation.

FIG. 6 illustrates the electronic device 100 in correspondence with still yet another manufacturing operation. The core 104 may be removed from the release film 200 and the carrier 202. Portions of the conductive material 204 may be removed, for instance with mechanical removal, etching, or the like. The adhesive 300 (shown in FIG. 3) may be removed, for instance to expose the component terminals 120. Accordingly, the core 104 may have the second surface 112.

As described herein, the continuous layer 126 of the molding material 124 may extend between the first surface 110 and the second surface 112 of the core 104. The core 104 may include one or more of the through vias 114 or the component terminals 120 exposed on the surfaces 110, 112 of the core 104. For example, the core 104 may include the first via surface 500 coplanar with the first surface 110. The core 104 may include a second via surface 600 coplanar with the second surface 112. Accordingly, the through vias 114 may extend between the first surface 110 and the second surface 112 of the core 104. The component terminals 120 of the passive electronic component 118 may have a terminal surface 602 coplanar with one or more of the first surface 110 or the second surface 112 of the core 104. Thus, the core 104 may include the passive electronic component 118 or the vias 114 embedded within continuous layer 126 of the molding material 124 in correspondence with the via surfaces 500, 600 and the terminal surfaces 602 exposed on the first surface 110 or second surface 112 of the core 104.

FIG. 7 illustrates the electronic device 100 in correspondence with a further manufacturing operation. As described herein, the substrate 102 may include the dielectric material 128 coupled with the core 104. In an example, the substrate 102 may include the dielectric material 128 coupled with the first surface 110 of the core 104 at the first interface 111. The substrate 102 may include the dielectric material 128 coupled with the second surface 112 of the core 104 at the second interface 113. In some examples, the substrate 102 may include the dielectric material 128 coupled with the surface 602 of the component terminal 120.

In another example, the substrate 102 may include the one or more electrical traces 116 in electrical communication with the through vias 114. For instance, a trace via 700 may extend between the through vias 114 and the traces 116. The trace via 700 may extend between the component terminals 120 and the traces 116. Accordingly, the trace via 700 may extend through one or more of the dielectric material 128 or the molding material 124.

Figure 8:
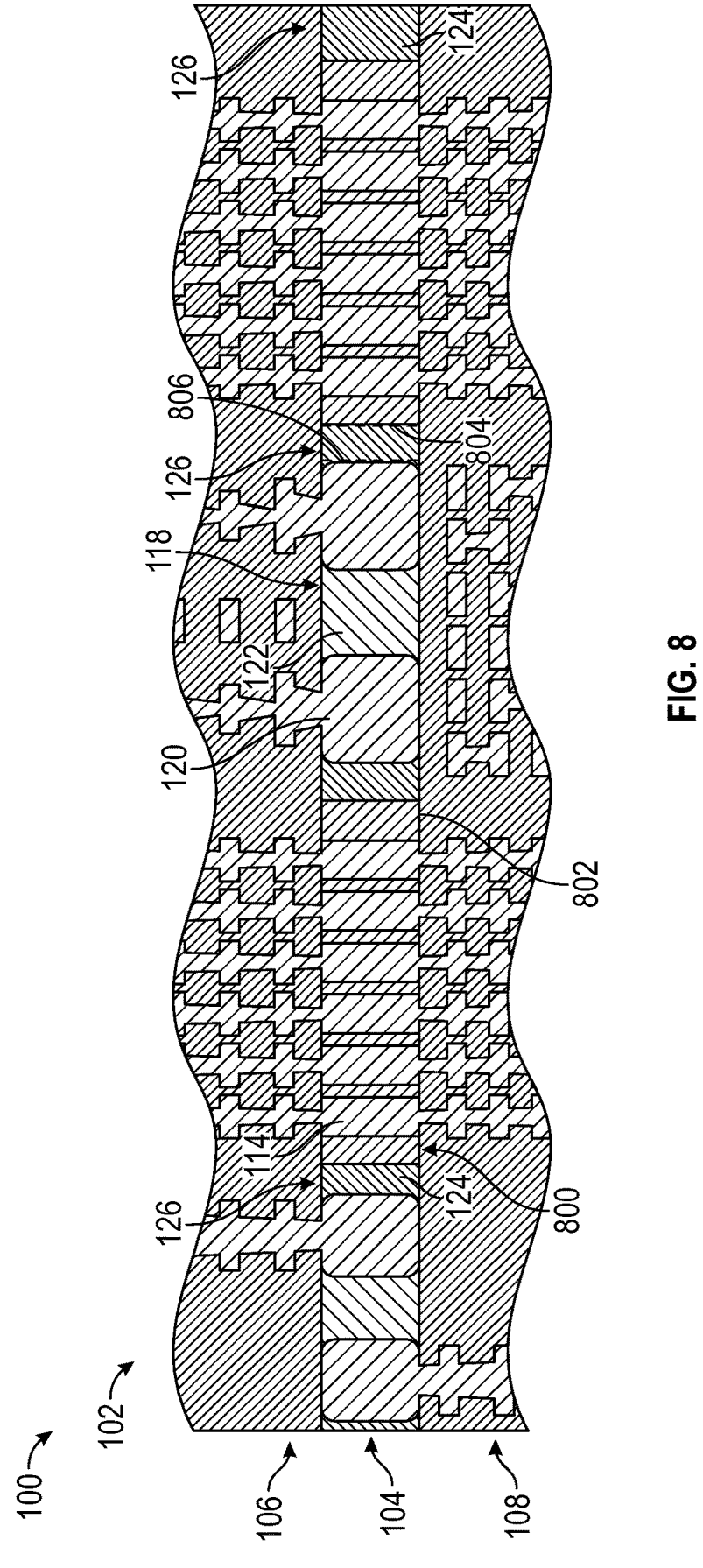
FIG. 8 illustrates a schematic view of another example of the electronic device.

FIG. 8 illustrates a schematic view of another example of the electronic device 100. The electronic device 100 may include a via array 800. In some examples, the via array 800 may comprise a semiconductor material. For instance, the via array 800 may include a semiconductor die. The semiconductor may include a conductive material comprising the through vias 114. Accordingly, the via array 800 may comprise one or more through silicon vias (however the present subject matter is not so limited). The via array 800 may have a tight pitch. In another example, the via array 800 has a pitch of approximately 100 micrometers or less. In yet another example, the via array 800 has a pitch of approximately 50 micrometers or less.

The via array 800 may comprise the one or more through vias 114. For instance, the via array 800 may include a non-conductive material 802 separating the through vias 114. The substrate 102 may include the via array 800 as a discrete component within the core 104. For example, the core 104 may include the molding material 124 coupled with the via array 800. The molding material 124 may form a direct interface with the via array 800. In an example, the core 104 may include the molding material 124 coupled with the non-conductive material 802 of the via array 800 at an array interface 804.

The continuous layer 126 of the molding material 124 may extend between the passive electronic component 118 and the via array 800. For instance, the core 104 may include the continuous layer 126 of the molding material 124 extending between the array interface 804 and a terminal interface 806. Accordingly, the continuous layer 126 of the molding material 124 may extend between the 800 and at least one of the component terminals 120 of the passive electronic component 118.

Figures 9, 10:
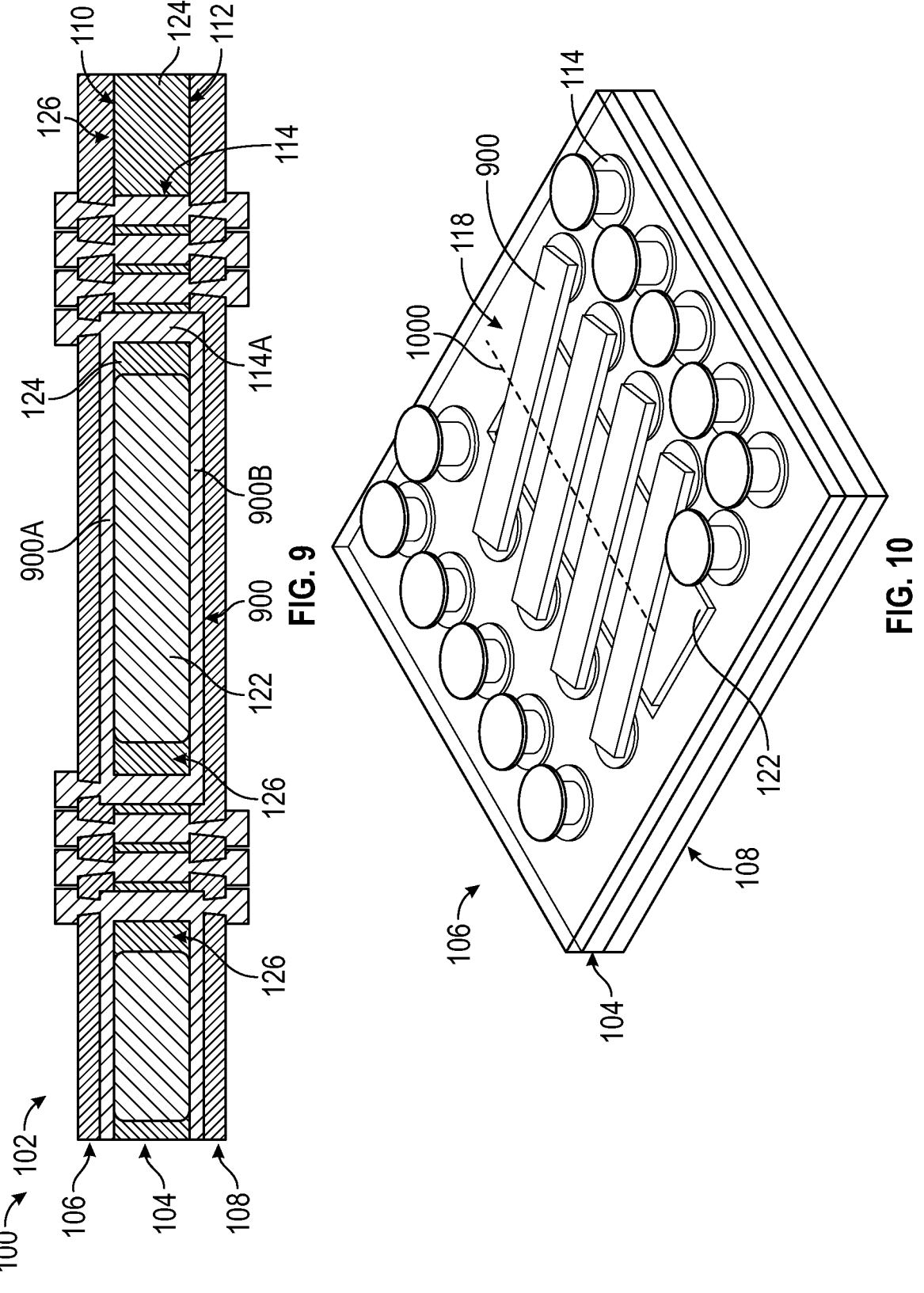
FIG. 9 illustrates a schematic view of yet another example of the electronic device.
FIG. 10 illustrates a perspective view of the electronic device of FIG. 9.

FIGS. 9 and 10 illustrate schematic and perspective views (respectively) of yet another example of the electronic device 100. The electronic device 100 may include one or more winding traces 900. In an example, one or more of the layers 106, 108 may include the winding traces 900. The substrate 102 may include the winding traces 900 coupled with one or more of the through vias 114.

The electronic device 100 may include the passive electronic component 118. The passive electronic component 118 may include one or more of the vias 114, central section 122, or the one or more winding traces 900. For example, the core 104 may include the central section 122, such as a magnetic material. The central section 122 may provide a core for an inductor. The one or more winding traces 900 may provide windings (e.g., turns, coils, or the like) the proximate central section 122 for the passive electronic device 100. Accordingly, one or more of the central section 122, vias 114, or the one or more winding traces 900 may cooperate to provide an inductor that includes the central section 122 within the continuous layer 126 of the molding material 124 in the core 104.

In an example, the central section 122 may extend between the first surface 110 and the second surface 112 of the core 104. The core 104 may include the continuous layer 126 of the molding material 124. Accordingly, the core 104 may include the molding material 124 coplanar with the central section 122 at the surfaces 110, 112.

The substrate 102 may include the one or more winding traces 900 coupled with the central section 122. In an example, the one or more winding traces 900 may extend along one or more of the first surface 110 or the second surface 112. For instance, the one or more winding traces 900 may extend across the central section 122. The substrate 102 may include the one or more winding traces 900 coupled with the continuous layer 126 of the molding material 124. In another example, the one or more winding traces 900 may extend at an angle across the central section 122 of the passive electronic component 118. For instance, the one or more winding traces 900 may extend at an offset with respect to the vias 114. In another example, the one or more winding traces 900 extend at an angle with respect to an axis 1000 of the central section 122. Accordingly, the one or more winding traces 900 and the vias 114 may cooperate to wrap a conductor around the central section 122, for instance to provide an inductor within the substrate 102.

In another example, the continuous layer 126 of the molding material 124 may extend between a first winding trace 900A and a second winding trace 900B. The continuous layer 126 of the molding material 124 may extend between a first through via 114A and the central section 122. The continuous layer 126 of the molding material 124 may extend between the through vias 114 and the central section 122. In yet another example, substrate 102 may include the first winding trace 900A and second winding trace 900B coupled with the first through via 114A. Accordingly, the continuous layer 126 of the molding material 124 may extend between each of the first through via 114A, the central section 122, the first winding trace 900A, and the second winding trace 900B.

Figures 11, 12:
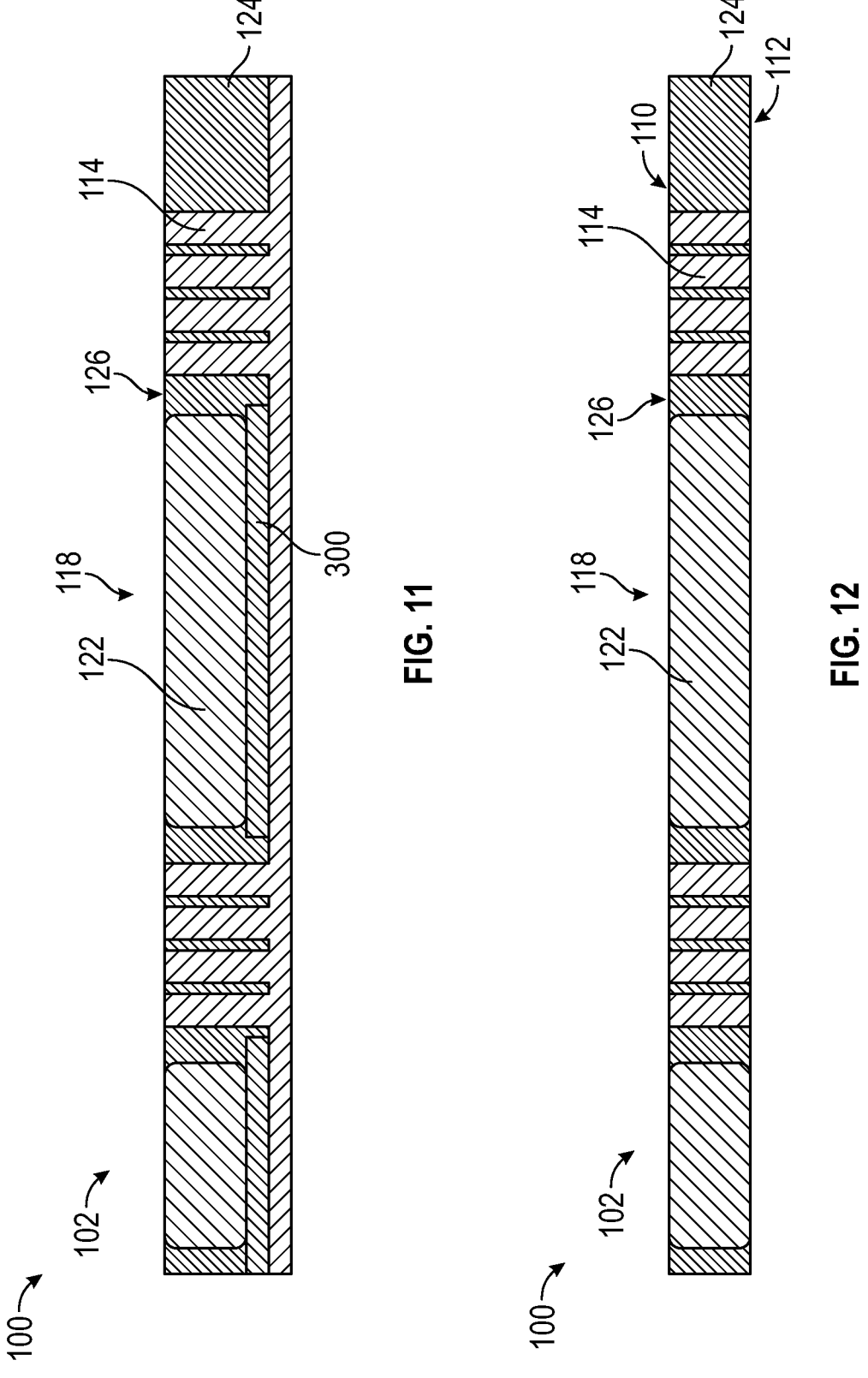
FIG. 11 illustrates the electronic device 100 of FIG. 9 during a manufacturing operation.
FIG. 12 illustrates the electronic device of FIG. 9 during another manufacturing operation.

FIG. 11 illustrates the electronic device 100 of FIG. 9 during a manufacturing operation. In an example, the central section 122 of the passive electronic component 118 may be located between the vias 114. For instance, the central section 122 may be coupled with the adhesive 300. The substrate 102 may include the continuous layer 126 of the molding material 124 coupled with one or more of the through vias 118 and the central section 122 of the passive electronic component 118

FIG. 12 illustrates the electronic device 100 of FIG. 9 during another manufacturing operation. In an example, portions of the core 104 are removed, such as through mechanical grinding of the core 104. Accordingly, the core 104 may include the surfaces 110, 112.

Figures 13, 14:
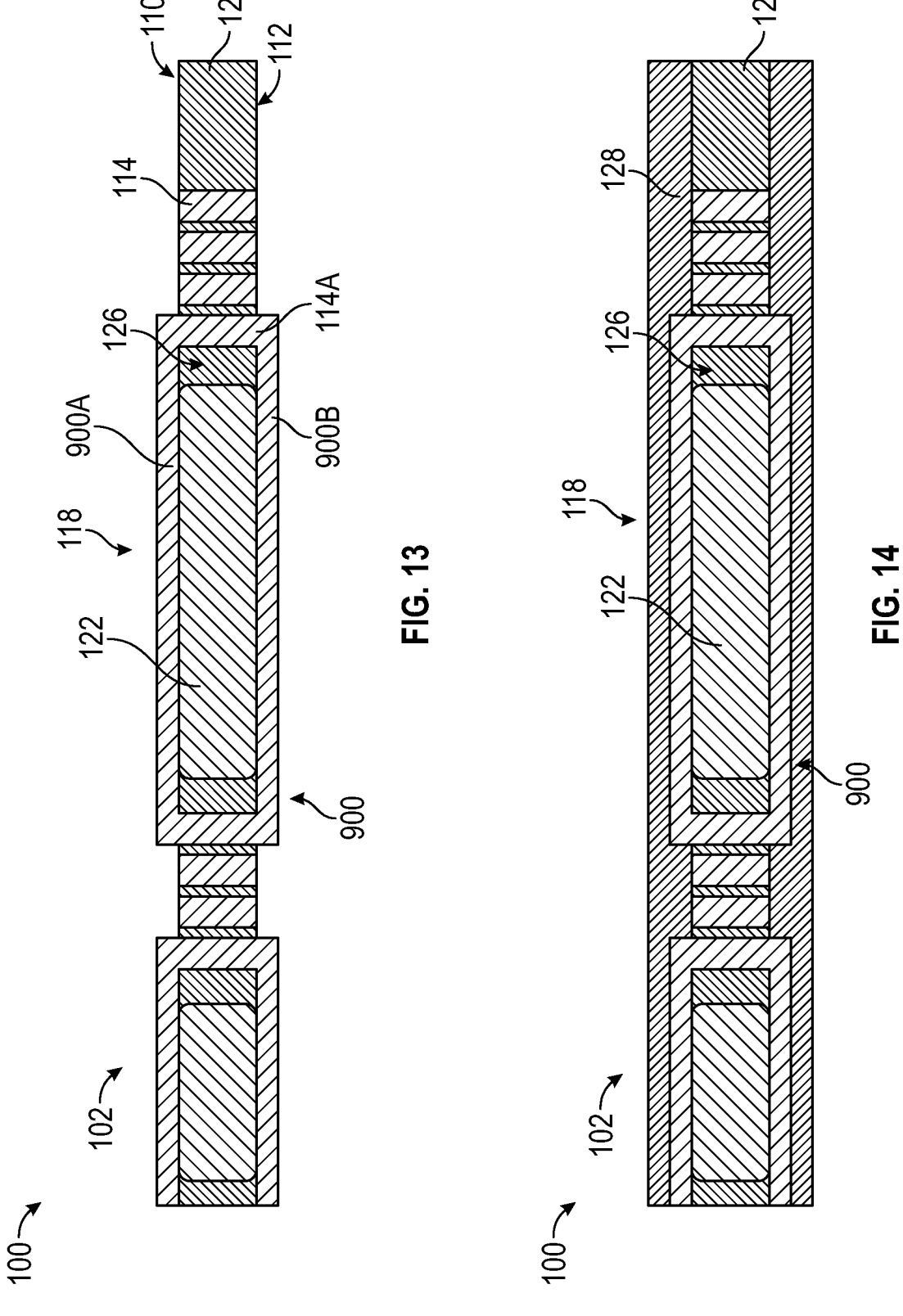
FIG. 13 illustrates the electronic device of FIG. 9 during yet another manufacturing operation.
FIG. 14 illustrates the electronic device of FIG. 9 during still yet another manufacturing operation.

FIG. 13 illustrates the electronic device 100 of FIG. 9 during yet another manufacturing operation. In an example, the substrate 102 may include the winding traces 900 coupled with one or more of the vias 114 and the central section 122, and the continuous layer of molding material 126. For instance, the first winding trace 900A may be coupled with the central section 122 at the first surface 110. The 900B may be coupled with the central section 122 at the second surface 112. Each of the first winding trace 900A and second winding trace 900B may be coupled with the through via 114A. Accordingly, one or more of the vias 114, central section 122, continuous layer 126 of the molding material 124, or the one or more winding traces 900 may cooperate to provide an inductor within the substrate 102.

FIG. 14 illustrates the electronic device 100 of FIG. 9 during still yet another manufacturing operation. The electronic device 100 may include the dielectric material 128. For instance, the substrate 102 may include the dielectric material 128 coupled with the one or more winding traces 900. The substrate 102 may include the dielectric material 128 coupled with the continuous layer 126 of the molding material 124. The substrate 102 may include the dielectric material 128 coupled with the central section 122 of the passive electronic component 118. The substrate 102 may include the dielectric material 128 coupled with the vias 114.

FIG. 15 illustrates one example of a method 1500 for manufacturing a substrate for an electronic device, including one or more of the electronic device 100 or the substrate 102 described herein. In describing the method 1500, reference is made to one or more components, features, functions and operations previously described herein. Where convenient, reference is made to the components, features, operations, and the like with reference numerals. The reference numerals provided are exemplary and are not exclusive. For instance, components, features, functions, operations and the like described in the method 1500 include, but are not limited to, the corresponding numbered elements provided herein and other corresponding elements described herein (both numbered and unnumbered) as well as their equivalents.

At 1502, the method 1500 may include locating a passive electronic component 118 proximate one or more through vias 114. For instance, locating the passive electronic component 118 may include locating the passive electronic component 118 coplanar with the one or more through vias 114. At 1504, the method 1500 may include encapsulating one or more of the passive electronic component 118 or the one or more through vias 114 in a continuous layer 126 of molding material 124. The continuous layer 126 of the molding material 124 coupled with a semiconductor material, for instance a semiconductor die. The molding material 124 may be continuous between at least one of the through vias 114 and the passive electronic component 118, At 1504, the method 1500 may include exposing one or more component terminals of the passive electronic component. For instance, portions of the molding material 124 and the component terminals 120 may be simultaneously removed (e.g., with cogrinding, or the like) to expose the component terminals 120. In yet another example, an adhesive 400 may be located proximate the through vias 114. The passive electronic component 118 may be coupled with the adhesive 400. The adhesive 400 may be removed, for instance to expose the component terminals 120.

Figure 16:
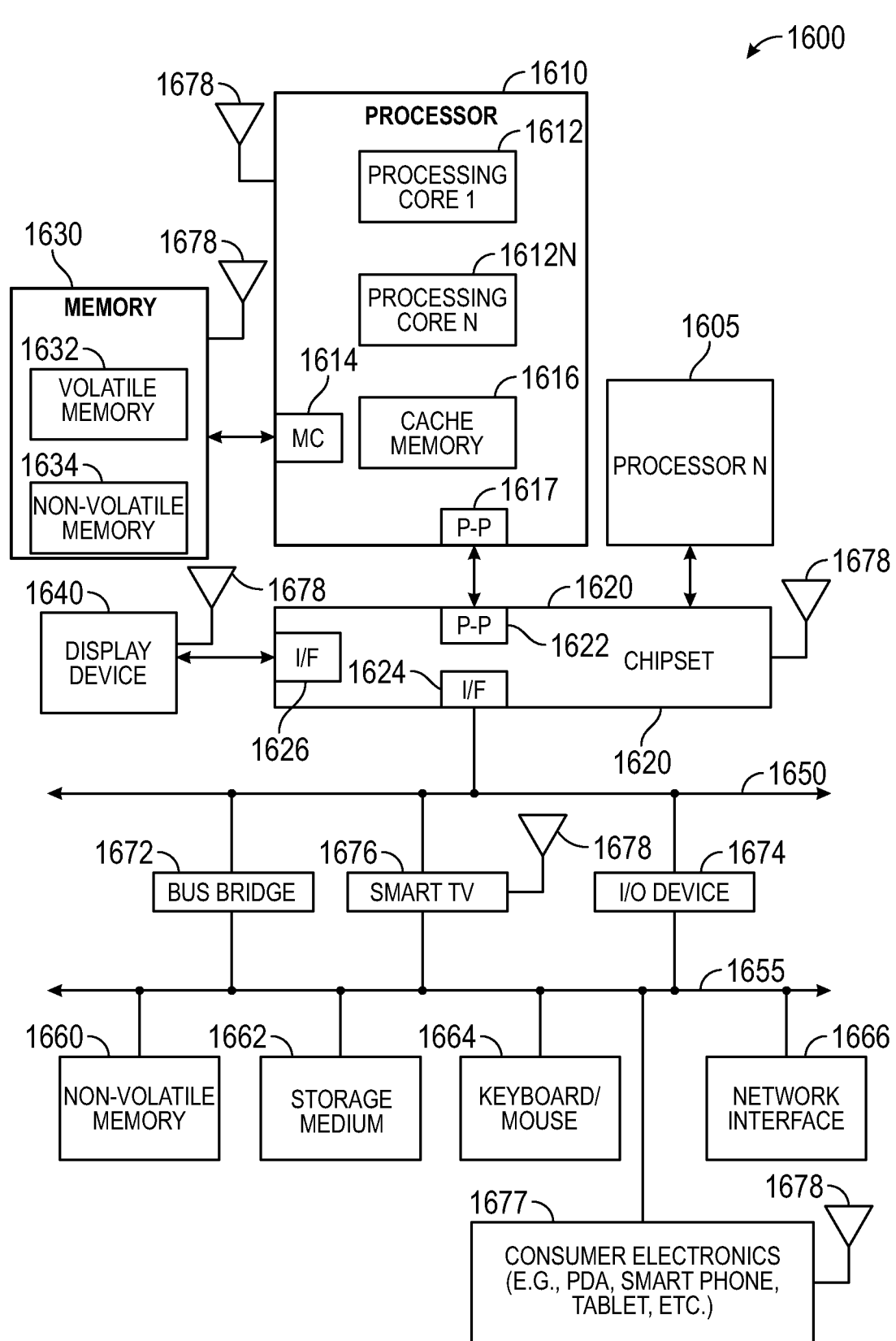
FIG. 16 illustrates a system level diagram, depicting an example of an electronic device.

FIG. 16 illustrates a system level diagram, depicting an example of an electronic device (e.g., system) including one or more of the electronic device 100 or the substrate 102 as described in the present disclosure. FIG. 16 is included to show an example of a higher level device application for one or more of the electronic device 100 or the substrate 102. In one embodiment, system 1600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1600 is a system on a chip (SOC) system.

In one embodiment, processor 1610 has one or more processor cores 1612 and 1612N, where 1612N represents the Nth processor core inside processor 1610 where N is a positive integer. In one embodiment, system 1600 includes multiple processors including 1610 and 1605, where processor 1605 has logic similar or identical to the logic of processor 1610. In some embodiments, processing core 1612 includes, but is not limited to, pre-fetch logic to fetch instructions, decode logic to decode the instructions, execution logic to execute instructions and the like. In some embodiments, processor 1610 has a cache memory 1616 to cache instructions and/or data for system 1600. Cache memory 1616 may be organized into a hierarchal structure including one or more levels of cache memory.

In some embodiments, processor 1610 includes a memory controller 1614, which is operable to perform functions that enable the processor 1610 to access and communicate with memory 1630 that includes a volatile memory 1632 and/or a non-volatile memory 1634. In some embodiments, processor 1610 is coupled with memory 1630 and chipset 1620. Processor 1610 may also be coupled to a wireless antenna 1678 to communicate with any device configured to transmit and/or receive wireless signals. In one embodiment, an interface for wireless antenna 1678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1634 includes, but is not limited to, flash memory, phase change memory (PCM), read-only memory (ROM), electrically erasable programmable read-only memory (EEPROM), or any other type of non-volatile memory device.

Memory 1630 stores information and instructions to be executed by processor 1610. In one embodiment, memory 1630 may also store temporary variables or other intermediate information while processor 1610 is executing instructions. In the illustrated embodiment, chipset 1620 connects with processor 1610 via Point-to-Point (PtP or P-P) interfaces 1617 and 1622. Chipset 1620 enables processor 1610 to connect to other elements in system 1600. In some embodiments of the example system, interfaces 1617 and 1622 operate in accordance with a PtP communication protocol such as the Intel® QuickPath Interconnect (QPI) or the like. In other embodiments, a different interconnect may be used.

In some embodiments, chipset 1620 is operable to communicate with processor 1610, 1605N, display device 1640, and other devices, including a bus bridge 1672, a smart TV 1676, I/O devices 1674, nonvolatile memory 1660, a storage medium (such as one or more mass storage devices) 1662, a keyboard/mouse 1664, a network interface 1666, and various forms of consumer electronics 1677 (such as a PDA, smart phone, tablet etc.), etc. In one embodiment, chipset 1620 couples with these devices through an interface 1624. Chipset 1620 may also be coupled to a wireless antenna 1678 to communicate with any device configured to transmit and/or receive wireless signals.

Chipset 1620 connects to display device 1640 via interface 1626. Display 1640 may be, for example, a liquid crystal display (LCD), a plasma display, cathode ray tube (CRT) display, or any other form of visual display device. In some embodiments of the example system, processor 1610 and chipset 1620 are merged into a single SOC. In addition, chipset 1620 connects to one or more buses 1650 and 1655 that interconnect various system elements, such as I/O devices 1674, nonvolatile memory 1660, storage medium 1662, a keyboard/mouse 1664, and network interface 1666. Buses 1650 and 1655 may be interconnected together via a bus bridge 1672.

In one embodiment, mass storage device 1662 includes, but is not limited to, a solid state drive, a hard disk drive, a universal serial bus flash memory drive, or any other form of computer data storage medium. In one embodiment, network interface 1666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 16 are depicted as separate blocks within the system 1600, the functions performed by some of these blocks may be integrated within a single semiconductor circuit or may be implemented using two or more separate integrated circuits. For example, although cache memory 1616 is depicted as a separate block within processor 1610, cache memory 1616 (or selected aspects of 1616) can be incorporated into processor core 1612.

Various Notes & Aspects

Example 1 is a substrate for an electronic device, the substrate comprising: a core having a first surface and a second surface, the core including: a passive electronic component within a continuous layer of molding material, the passive electronic component including one or more component terminals; one or more through vias extending between the first surface of the core and the second surface of the core; a first layer coupled with the first surface of the core at a first interface; a second layer coupled with the second surface of the core at a second interface; and wherein the one or more component terminals facilitate electrical communication between the passive electronic component and one or more of the first layer or the second layer.

In Example 2, the subject matter of Example 1 optionally includes wherein the core is a discrete unit with the first layer and second layer on opposing sides of the core.

In Example 3, the subject matter of any one or more of Examples 1-2 optionally include wherein the continuous layer of molding material has a first grain structure and the first layer has a second grain structure, the second grain structure different than the first grain structure.

In Example 4, the subject matter of any one or more of Examples 1-3 optionally include wherein the one or more contact terminals comprise a terminal surface and the terminal surface is coplanar with one or more of the first surface or the second surface of the core.

In Example 5, the subject matter of any one or more of Examples 1~4 optionally include wherein: the one or more component terminals include a first component terminal and a second component terminal; and the passive electronic component includes a central section coupled with the first component terminal and the second component terminal.

In Example 6, the subject matter of Example 5 optionally includes wherein the passive electronic component comprises an inductor.

In Example 7, the subject matter of Example 6 optionally includes wherein the central section of the passive electronic component comprises a magnetic material.

In Example 8, the subject matter of any one or more of Examples 1-7 optionally include wherein the one or more through vias are included in a discrete via array, the discrete via array having a dielectric material coupled with the one or more through vias.

In Example 9, the subject matter of Example 8 optionally includes wherein the continuous layer of molding material is coupled with the dielectric material of the discrete via array at a third interface.

In Example 10, the subject matter of Example 9 optionally includes wherein the continuous layer of molding material has a first grain structure and the dielectric material of discrete via array has a second grain structure, the second grain structure different than the first grain structure.

In Example 11, the subject matter of any one or more of Examples 1-10 optionally include wherein the passive electronic component comprises one or more of an inductor, a capacitor, or a resistor.

Example 12 is a substrate for an electronic device, comprising: a core having a first surface and a second surface, the core including: a passive electronic component within a continuous layer of molding material, the passive electronic component including one or more component terminals; one or more through vias extending between the first surface of the core and the second surface of the core, wherein: the one or more through vias are included in a discrete via array, the discrete via array coupled with the molding material at an interface; and the continuous layer of molding material is coupled with the dielectric material of the discrete via array at a third interface; a first layer coupled with the first surface of the core at a first interface; a second layer coupled with the second surface of the core at a second interface; and wherein the one or more component terminals facilitate electrical communication between the passive electronic component and one or more of the first layer or the second layer.

In Example 13, the subject matter of Example 12 optionally includes wherein the core is a discrete unit with the first layer and second layer on opposing sides of the core.

In Example 14, the subject matter of any one or more of Examples 12-13 optionally include wherein: the one or more through vias of the discrete via array comprise a first through via and a second through via; and the first through via is spaced from the second through via at a pitch of less than or equal to 14 is missing parent: 50 micrometers.

In Example 15, the subject matter of any one or more of Examples 12-14 optionally include wherein the discrete via array comprises a semiconductor material.

Example 16 is a method of manufacturing a substrate for an electronic device, comprising: locating a passive electronic component proximate one or more through vias, locating the passive electronic component includes the passive electronic component coplanar with the one or more through vias; encapsulating the passive electronic component and the one or more through vias in a continuous layer of molding material, wherein the molding material is continuous between at least one of the through vias and the passive electronic component; and exposing one or more component terminals of the passive electronic component.

In Example 17, the subject matter of Example 16 optionally includes wherein the molding material is continuous between at least one of the through vias and the passive electronic component.

In Example 18, the subject matter of any one or more of Examples 16-17 optionally include wherein the one or more through vias are included in a discrete via array, the discrete via array including a dielectric material coupled to the one or more through vias, and wherein the molding material is continuous between the passive electronic component and the dielectric material of the discrete via array.

In Example 19, the subject matter of Example 18 optionally includes wherein: the continuous layer of molding material has a first grain structure; and the dielectric material of the discrete via array has a second grain structure different than the first grain structure.

In Example 20, the subject matter of any one or more of Examples 18-19 optionally include wherein the one or more through vias are included in a discrete via array, and the discrete via array comprises a semiconductor material.

In Example 21, the subject matter of Example 20 optionally includes wherein the encapsulating the passive electronic component and the one or more through vias includes coupling the continuous layer of molding material with the semiconductor material.

In Example 22, the subject matter of any one or more of Examples 16-21 optionally include wherein exposing the one or more component terminals includes simultaneously removing portions of the molding material and the component terminals.

In Example 23, the subject matter of any one or more of Examples 16-22 optionally include locating an adhesive proximate the one or more through vias.

In Example 24, the subject matter of Example 23 optionally includes wherein locating the passive electronic component proximate the one or more through vias includes coupling the passive electronic component with the adhesive.

In Example 25, the subject matter of any one or more of Examples 16-24 optionally include wherein exposing the one or more component terminals includes simultaneously removing portions of the molding material and an adhesive coupled with the passive electronic component.

Each of these non-limiting aspects can stand on its own, or can be combined in various permutations or combinations with one or more of the other aspects.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A substrate for an electronic device, the substrate comprising:

a core having a first surface and a second surface, the core including:

a passive electronic component within a continuous layer of molding material, the passive electronic component including one or more component terminals;

one or more through vias extending between the first surface of the core and the second surface of the core;

a first layer coupled with the first surface of the core at a first interface; and a second layer coupled with the second surface of the core at a second interface, wherein the one or more component terminals facilitate electrical communication between the passive electronic component and one or more of the first layer or the second layer, and wherein the continuous layer of molding material has a first grain structure and the first layer has a second grain structure, the second grain structure different from the first grain structure.

2. The substrate of claim 1, wherein the core is a discrete unit with the first layer and second layer on opposing sides of the core.

3. The substrate of claim 1, wherein the one or more component terminals comprise a terminal surface and the terminal surface is coplanar with one or more of the first surface or the second surface of the core.

4. The substrate of claim 1, wherein:

the one or more component terminals include a first component terminal and a second component terminal; and the passive electronic component includes a central section coupled with the first component terminal and the second component terminal.

5. The substrate of claim 4, wherein the passive electronic component comprises an inductor.

6. The substrate of claim 5, wherein the central section of the passive electronic component comprises a magnetic material.

7. The substrate of claim 1, wherein the one or more through vias are included in a discrete via array, the discrete via array having a dielectric material coupled with the one or more through vias.

8. The substrate of claim 7, wherein the continuous layer of molding material is coupled with the dielectric material of the discrete via array at a third interface.

9. The substrate of claim 8, wherein the dielectric material of discrete via array has a third grain structure, and the third grain structure different from the first grain structure.

10. The substrate of claim 1, wherein the passive electronic component comprises one or more of an inductor, a capacitor, or a resistor.

11. A process of fabricating a substrate for an electronic device, the process comprising:

providing a core having a first surface and a second surface, the core including an electronic component within a continuous layer of an insulator material, wherein the electronic component includes one or more terminals;

providing one or more vias extending between the first surface of the core and the second surface of the core;

providing a first layer coupled with the first surface of the core at a first interface; and providing a second layer coupled with the second surface of the core at a second interface, wherein the continuous layer of the insulator material has a first grain structure, the first layer has a second grain structure, and the second grain structure different from the first grain structure.

12. The process of claim 11, wherein the insulator material is continuous between at least one of the one or more vias and the electronic component.

13. The process of claim 11, wherein the one or more vias are included in a discrete via array, the discrete via array including a dielectric material coupled to the one or more vias, and wherein the insulator material is continuous between the passive electronic component and the dielectric material of the discrete via array.

14. The process of claim 13, wherein:

the dielectric material of the discrete via array has a third grain structure different from the first grain structure.

15. The process of claim 13, wherein the one or more vias are part of a discrete via array, and the discrete via array comprises a semiconductor material.

16. A substrate for an electronic device, the substrate comprising:

a core having a first surface and a second surface, the core including an electronic component within a continuous layer of an insulator material, wherein the electronic component includes one or more terminals;

one or more vias extending between the first surface of the core and the second surface of the core;

a first layer coupled with the first surface of the core at a first interface; and a second layer coupled with the second surface of the core at a second interface;

wherein the continuous layer of the insulator material has a first grain structure, the first layer has a second grain structure, and the second grain structure different from the first grain structure.

17. The substrate of claim 16, wherein the core is a discrete unit with the first layer and second layer on opposing sides of the core.

18. The substrate of claim 16, wherein the one or more terminals comprise a terminal surface and the terminal surface is coplanar with one or more of the first surface or the second surface of the core.

19. The substrate of claim 16, wherein:

the one or more terminals include a first component terminal and a second component terminal; and the electronic component includes a central section coupled with the first component terminal and the second component terminal.

20. The substrate of claim 19, wherein the electronic component comprises an inductor.

21. The substrate of claim 20, wherein the central section of the electronic component comprises a magnetic material.

22. The substrate of claim 16, wherein the one or more vias are included in a discrete via array, the discrete via array having a dielectric material coupled with the one or more vias.

23. The substrate of claim 22, wherein the continuous layer of the insulator material is coupled with the dielectric material of the discrete via array at a third interface.

24. The substrate of claim 23, wherein the dielectric material of discrete via array has a third grain structure, and the third grain structure different from the first grain structure.

25. The substrate of claim 16, wherein the electronic component comprises one or more of an inductor, a capacitor, or a resistor.

* * * * *